United States Patent
Miyagawa et al.

[11] Patent Number: 5,936,389
[45] Date of Patent: *Aug. 10, 1999

[54] TERMINATING RESISTANCE CIRCUIT

[75] Inventors: Takao Miyagawa; Hidenobu Sakai, both of Nagaokakyo, Japan

[73] Assignee: Murata Manufacturing Co., Ltd.

[*] Notice: This patent issued on a continued prosecution application filed under 37 CFR 1.53(d), and is subject to the twenty year patent term provisions of 35 U.S.C. 154(a)(2).

[21] Appl. No.: 08/726,547

[22] Filed: Oct. 7, 1996

Related U.S. Application Data

[63] Continuation of application No. 08/541,016, Oct. 11, 1995, abandoned, which is a continuation of application No. 08/247,513, May 23, 1994, abandoned, which is a continuation of application No. 08/089,113, Jul. 8, 1993, abandoned.

[30] Foreign Application Priority Data

Jul. 8, 1992 [JP] Japan .................................. 4-205959

[51] Int. Cl.$^6$ ........................................................ G05F 1/44
[52] U.S. Cl. .......................................................... 323/282
[58] Field of Search ................................ 323/282, 908; 361/93, 111; 395/325

[56] References Cited

U.S. PATENT DOCUMENTS

| | | | |
|---|---|---|---|
| 4,108,404 | 8/1978 | Ubel | 246/34 CT |
| 5,122,724 | 6/1992 | Criss | 323/222 |
| 5,309,569 | 5/1994 | Warchol | 395/325 |

FOREIGN PATENT DOCUMENTS

| | | |
|---|---|---|
| 2117143 | 3/1983 | United Kingdom . |
| 2190520 | 4/1987 | United Kingdom . |

*Primary Examiner*—Adolf Denake Berhane
*Attorney, Agent, or Firm*—Ostrolenk, Faber, Gerb & Soffen, LLP

[57] ABSTRACT

A terminating resistance circuit is used for a bus line in which a power source line, signal lines and ground lines are connected between computer equipment via terminators, respectively. An input terminal of a regulator is connected to the power source line, and the terminator is connected between an output terminal of the regulator and the signal line. A zener diode is connected between the output terminal and the ground line in such a manner that a cathode terminal and an anode terminal of the zener diode are connected to the output terminal of the regulator and the ground line, respectively.

8 Claims, 7 Drawing Sheets

TERMINATING RESISTANCE CIRCUIT

This is a Continuation of application Ser. No. 08/541,016, filed Oct. 11, 1995, now abandoned which is a continuation application of Ser. No. 08/247,513, filed on May 23, 1994 now abandoned, which is a continuation of application Ser. No. 08/089,113, filed on Jul. 8, 1993 now abandoned, by Takao MIYAGAWA et al. entitled "TERMINATING RESISTANCE CIRCUIT".

BACKGROUND OF THE INVENTION

1. Field of the Invention

The present invention relates to a terminating resistance circuit in an SCSI (Small Computer System Interface) system, and more particularly, to a terminating resistance circuit for a bus line between computer equipment in an improved version of an SCSI system.

2. Description of the Background Art

A connection of a bus line such as an SCSI-2, etc. for computer equipment is described in Japanese Patent Application No. 3-61174, which constitutes a background of the invention.

Figure 4:
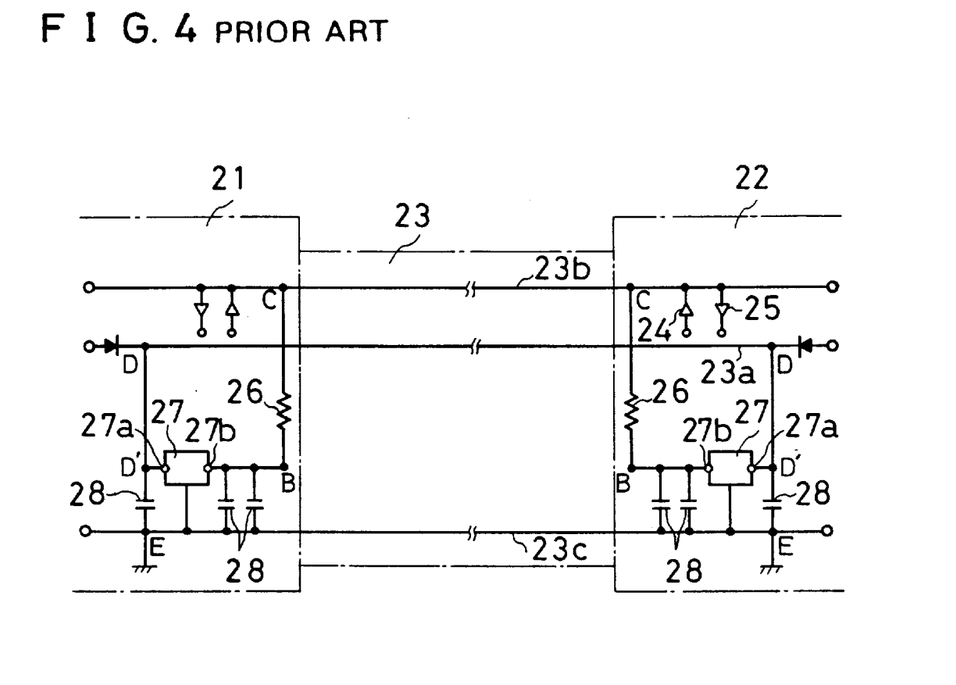
FIG. 4 is a schematic diagram for explaining an example in which conventional computer equipment constituting an initiator and a target are connected to each other.

More specifically, a connection example of such an SCSI-2 is shown in FIG. 4. FIG. 4 shows an example of a system for the SCSI-2, which is called as a single-ended type. In FIG. 4, the reference numeral 21 denotes an initiator such as a host computer, the reference numeral 22 denotes a target such as a CD-ROM device, and the reference numeral 23 denotes an SCSI bus line for connecting the initiator 21 and the target 22. As the bus line 23, a cable a with connector, the number of terminals of which is 50 or 68 is used. The bus line 23 includes a power source line 23a, a signal line 23b and a ground line 23c. The power source line 23a is a single line, to which 5V is applied normally. The signal line 23b is illustrated as a single line, but in fact, 18 signal lines are included therein. The ground line 23c also includes a plurality of ground lines. The reference numerals 24 and 25 denote a driver and a receiver, respectively for sending a signal to the signal line 23b and for receiving a signal from the signal line 23b.

The reference numeral 26 denotes a terminator connected to the signal line 23b. The terminator 26 is used for matching an impedance of a bus cable, and therefore, a signal of "0" or "1" is transmitted between the SCSI devices such as a initiator 21, the target 22 etc. reliably as a rectangular wave. Accordingly, it is necessary to provide the terminator 26 for each of the SCSI devices such as the initiator 21, the target 22 etc. Since the number of the signal lines 23b is 18, eighteen terminators 26 are to be provided in a case of a circuit of the single-ended type. In addition, a resistance value of the terminator 26 is 110 ohms. The reference numeral 27 denotes a regulator having an input terminal 27a and an output terminal 27b which are connected to a side of the power source line 23a and a side of the terminator 26, respectively. The regulator 27 is for adjusting a voltage at the power source line 23a, that is, normally 5V, to 2.85V to supply a constant voltage to the terminator 26. The reference numeral 28 denotes a capacitor provided between the vicinity of the regulator 27 and the ground line 23c, which is for removing noise and ripple on the power source line 23a and an output side of the regulator 27.

In order to attach or detach the terminator 26 to or from the bus line 23 in the terminating resistance circuit, a plurality of switching elements (not shown) each of which is an active element are provided between the terminator 26 and the output terminal 27b of the regulator, that is, at B point. Since the number of the terminators 26 is to be equal to the number of the signal lines 23b, the number of switching elements is also corresponding to the number of the terminators 26.

Figure 5:
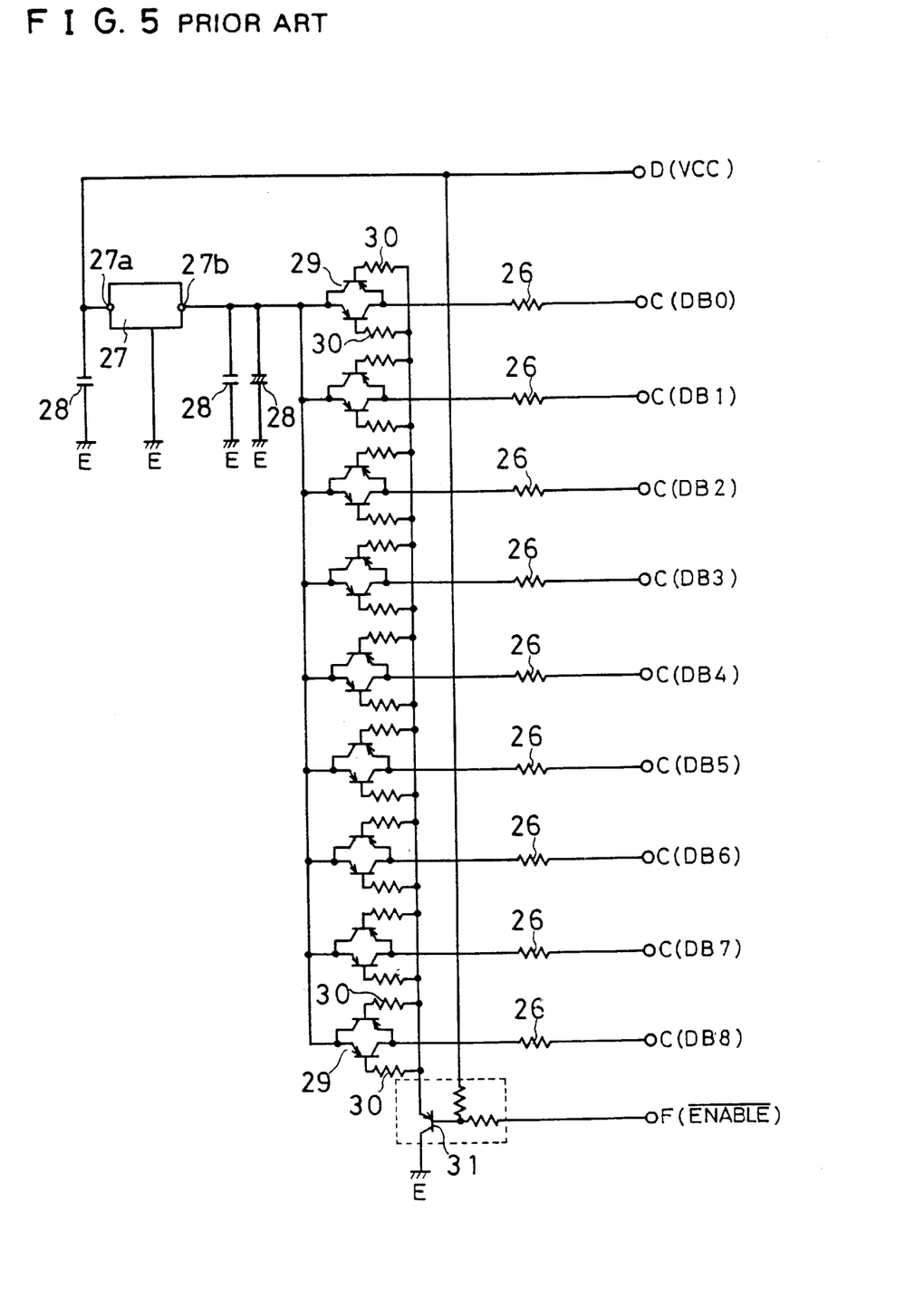
FIG. 5 is a circuit diagram showing a conventional terminating resistance circuit.

In general, the terminator 26, the regulator 27, the capacitor 28, etc. constituting the above described terminating resistance circuit are incorporated within an integrated circuit together with the switching elements, and one example of the integrated circuit is shown in FIG. 5. C point, D point and E point of FIG. 5 are respectively corresponding to C point, D point and E point of FIG. 4. In FIG. 5, the reference numeral 29 denotes a switching element provided between the terminator 26 and the regulator 27, which is constituted by two PNP transistors. The reference numeral 30 denotes a bias resistor for biasing the switching element 29, and the reference numeral 31 (a portion surrounded by a dotted line) is a switching element which is a transistor incorporating resistor. The switching element 31 functions as a switch for turning the switching element 29 on or off in response to a signal from an exterior source. Although only 9 of the terminators 26 are illustrated for simplifying the drawing, in fact, the number of terminators 26 is 18, that is, the number of the signal lines. In addition, in a case where only 9 terminators 26 are provided as shown in FIG. 5, two integrated terminating resistance circuits may be utilized.

Figure 6:
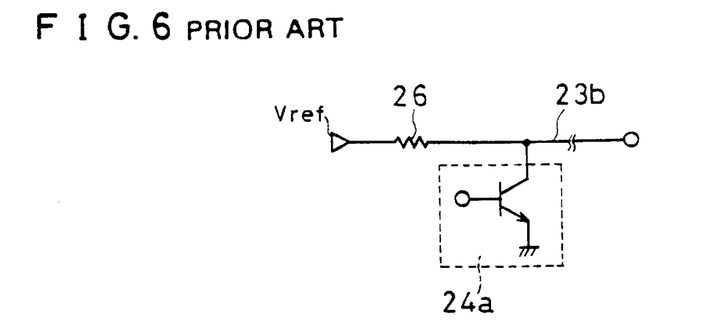
FIG. 6 is a circuit diagram showing a driver connected to a signal line.
Figure 7:
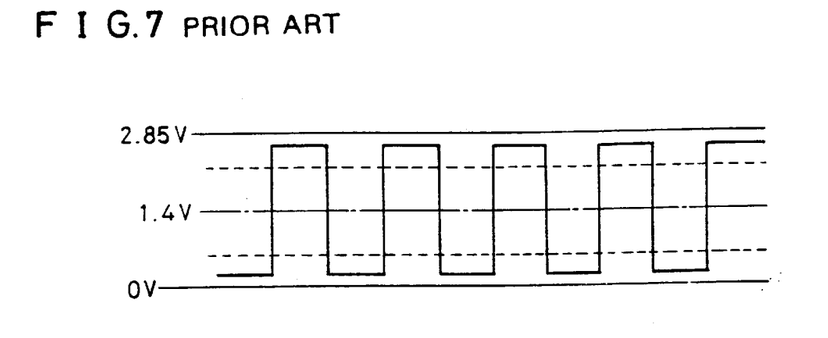
FIG. 7 is a chart showing a waveform of the signal line.

Next, transmission of signals will be described. FIG. 6 is an illustrative view showing a major portion of a terminating resistance circuit in a case where an opened collector type driver 24a is utilized for the driver 24 shown in FIG. 4. Vref of FIG. 6 shows the output voltage 2.85V from the regulator shown in FIG. 4. Furthermore, the driver 24a is mainly constituted by a single NPN transistor, and a signal responsive to a signal at the signal line 23b is inputted to a base thereof. The signal at the signal line 23b is a rectangular wave having levels of 0 to 2.85V as shown in FIG. 7. Therefore, the above described transistor is turned-on or off at a level of a threshold value shown by a dotted line in FIG. 7. Therefore, in FIG. 6, if the transistor is turned-on, the signal line 23b is connected to the ground, and thus, a signal of the low level is transmitted. In contrast, if the transistor is turned-off, the signal line 23b is not connected to the ground, and therefore, a signal of the high level is transmitted.

However, in a case where the above described driver 24a is utilized, when a cable of the bus line 23 is long or when a high frequency signal is to be transmitted, there is an occasion that the approximately 2.85V signal level of the high level at the signal line 23b is lowered by about 1V, and therefore, it becomes impossible for the transistor of the receiver within the other target to detect the high level. Resultingly, there was a problem that the signal cannot be transmitted reliably.

Figure 8:
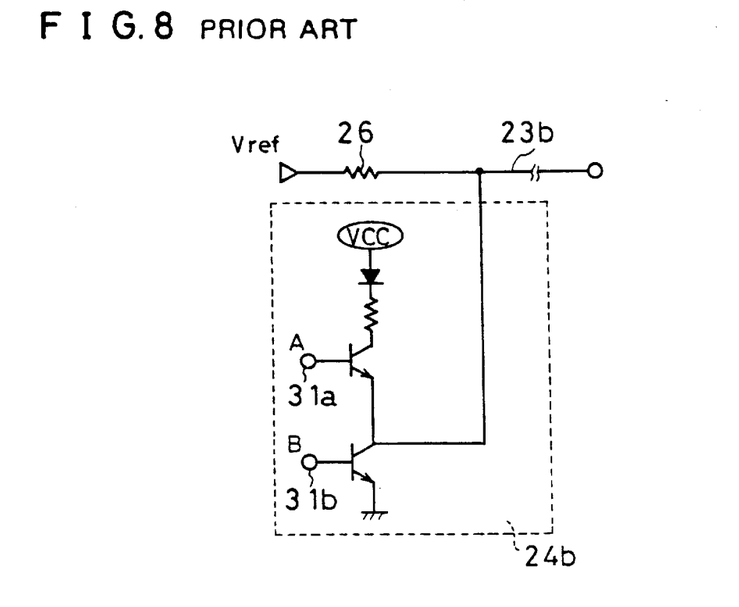
FIG. 8 is a circuit diagram showing a driver connected to a signal line.

Therefore, the above described problem can be solved if an active negation circuit 24b is utilized for the driver as shown in FIG. 8. The driver 24b is mainly constituted by two NPN transistors 31a and 31b and a power source VCC for supplying a power voltage of 5V. To the bases of the transistors 31a and 31b, signals are applied which are alternately inverted to each other in response to a signal responsive to a signal at the signal line 23b. Therefore, if the transistor 31a is turned-off and the transistor 31b is turned-on, the signal line 23b is connected to the ground, and therefore, the signal line 23b becomes the low level. In contrast, if the transistor 31a is turned-on and the transistor 31b is turned-off, since the voltage of 5V is supplied to the signal line 23b, the signal line 23b becomes the high level. Thus, when the driver 24b is utilized, since the high level of 5V is higher than that of the driver 24a, the high level is not erroneously detected even if the level thereof is lowered by about 1V.

Figure 9:
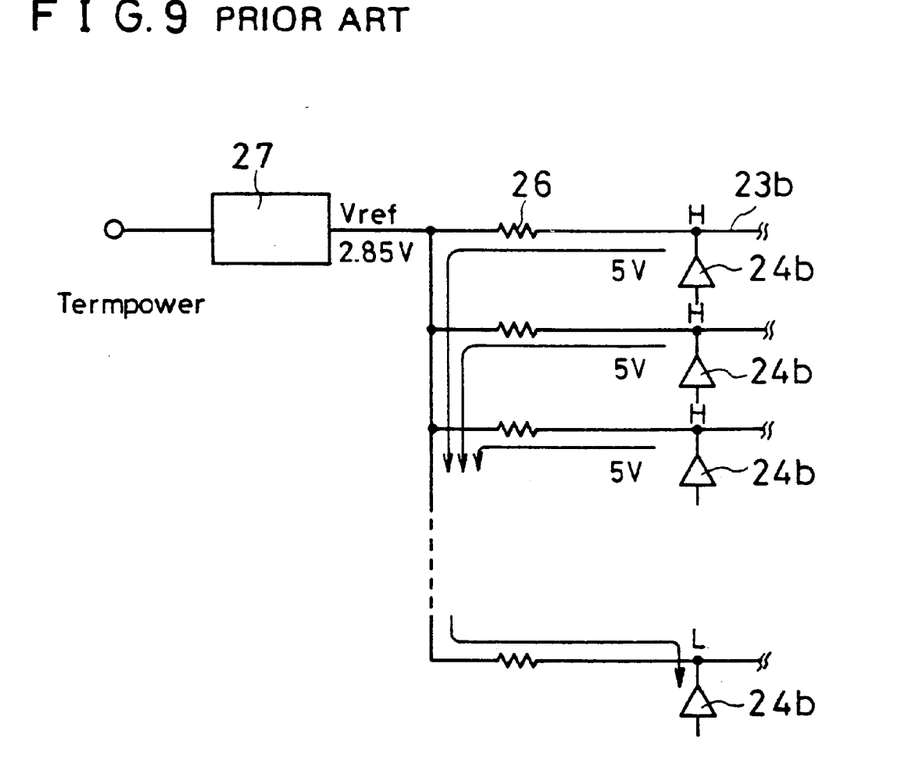
FIG. 9 is a schematic diagram showing a major portion of the terminating resistance circuit.

However, as shown in FIG. 9, it is necessary to provide the above described driver 24 for each signal line 23b. If the high level of the signal line 23b, 5V, is applied to the regulator 27, a current flows to a signal line which is at the low level. For example, in the terminating resistance circuit which is connected to 9 signal lines as shown in FIG. 5, when the signals at 8 signal lines are the high levels, an overcurrent will flow to a driver which is connected to the remaining signal line which is at the low level. Resultingly, there was an occasion that the driver is destroyed.

SUMMARY OF THE INVENTION

Therefore, a principal object of the present invention is to provide a novel terminating resistance circuit.

Another object of the present invention is to provide a terminating resistance circuit in which a signal can be transmitted reliably and a controller such as a driver etc. cannot be destroyed.

In order to implement above described object, a terminating resistance circuit according to the present invention is a terminating resistance circuit in a bus line in which a power source line, a signal line, and a ground line are connected between computer equipment through terminators, respectively, and characterized in that an input terminal of a regulator is connected to the power source line, a terminator is connected between an output terminal of the regulator and the signal line, and a zener diode is connected between the output terminal of the regulator and the ground line in a manner that a cathode terminal of the zener diode is connected to the output terminal of the regulator and an anode terminal of the zener diode is connected to the ground line.

As described above, in a terminating resistance circuit according to the present invention, since the zener diode is connected between the output terminal of the regulator and the ground line, if a zener diode having a zener voltage of approximately 3V is selected for example, even if a voltage of 5V is applied to the terminator when a signal at the signal line is the high level, a voltage of the terminator at a side of regulator becomes approximately 3V, and therefore, no overcurrent flows in a controller such as a driver, receiver etc. connected to a signal line of the low level. Therefore, the controller is not destroyed.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
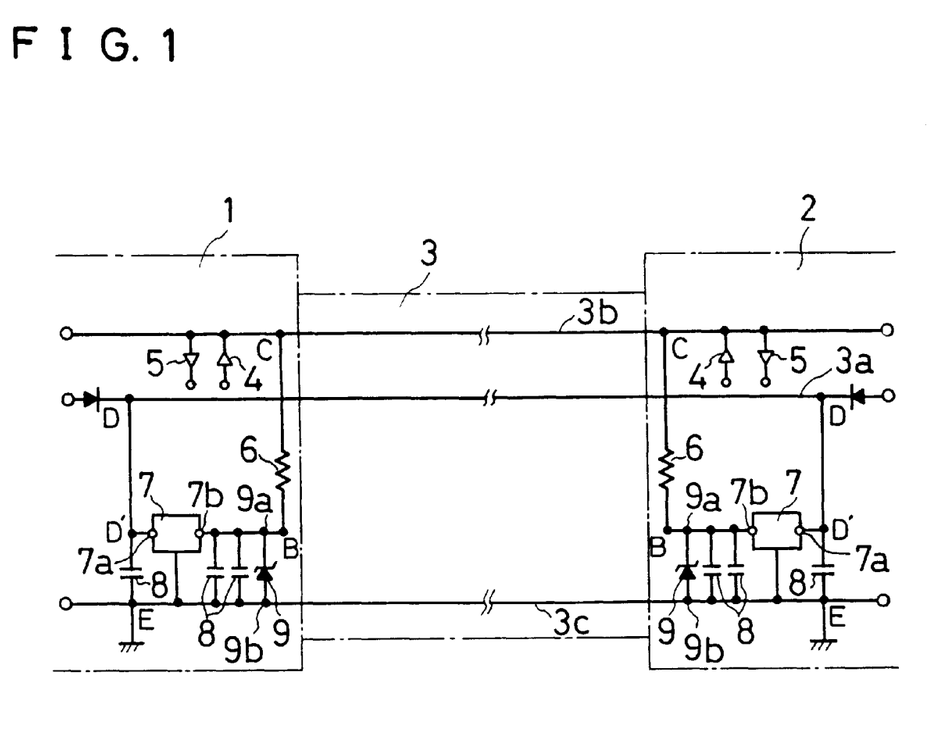
FIG. 1 is a schematic diagram for explaining an example in which computer equipments to which the present invention is applied are connected to each other.

With reference to FIG. 1 which shows a connection example of SCSI-2, the reference numeral 1 denotes an initiator such as a host computer, the reference numeral 2 denotes a target such as a CD-ROM device, and the reference numeral 3 denotes an SCSI bus line for connecting the initiator 1 and the target 2. As the bus line 3, a cable with connector the number of terminals of which is 50 or 68 is used. The bus line 3 includes a power source line 3a, a signal line 3b and a ground line 3c. The power source line 3a is a single line, to which 5V is applied normally. The signal line 3b is illustrated as a single line, but in fact, 18 signal lines are included therein. The ground line 3c also includes a plurality of ground lines. The reference numerals 4 and 5 denote a driver and a receiver, respectively for sending the signal line 3b and for receiving a signal from the signal line 3b.

The reference numeral 6 denotes a terminator connected to the signal line 3a. The terminator 6 is used for matching an impedance of a bus cable such that a signal of "0" or "1" can be transmitted between the SCSI devices such as an initiator 1, the target 2 etc. as a precise rectangular wave. Accordingly, it is necessary to provide the terminator 6 for each of the SCSI devices such as an initiator 1, the target 2, etc. Since the number of the signal lines 3b is 18, eighteen terminators 6 are to be provided in a case of a circuit of the single-ended type. In addition, a resistance value of the terminator 6 is 110 ohms. The reference numeral 7 denotes a regulator having an input terminal 7a and an output terminal 7b which are connected to a side of the power source line 3a and a side of the terminator 6, respectively. The regulator 7 is for adjusting a voltage at the power source line 3a, that is, normally 5V, to 2.85V to supply a constant voltage to the terminator 6. The reference numeral 8 denotes a capacitor provided between the vicinity of the regulator 7 and the ground line 3c, which is for removing a noise and ripple on the power source line 3a and an output side of the regulator 7.

The reference numeral 9 denotes a zener diode having a cathode terminal 9a connected to the output terminal 7b of the regulator 7 and an anode terminal 9b connected the the ground line 3c. The zener diode 9 is one having a zener voltage of approximately 3V in this embodiment, and it is preferable to use a zener diode having a zener voltage which is approximately equal to the output voltage of the regulator 7, that is, Vref, but, the zener voltage is needed to be higher than the Vref. A reason why is that if the zener voltage is lower than Vref, the current always flows from the regulator 7 to the zener diode 9, and therefore, the reliability of the regulator 7 and the zener diode 9 is lowered.

In order to attach or detach the terminator 6 to or from the bus line 3 in the terminating resistance circuit, a plurality of switching elements (not shown) each of which is an active element are provided between the terminator 6 and the output terminal 7b of the regulator, that is, at B point. Since the number of the terminators 6 is to be equal to the number of the signal lines 3b, the number of switching elements is also corresponding to the number of the terminators 6.

Figure 2:
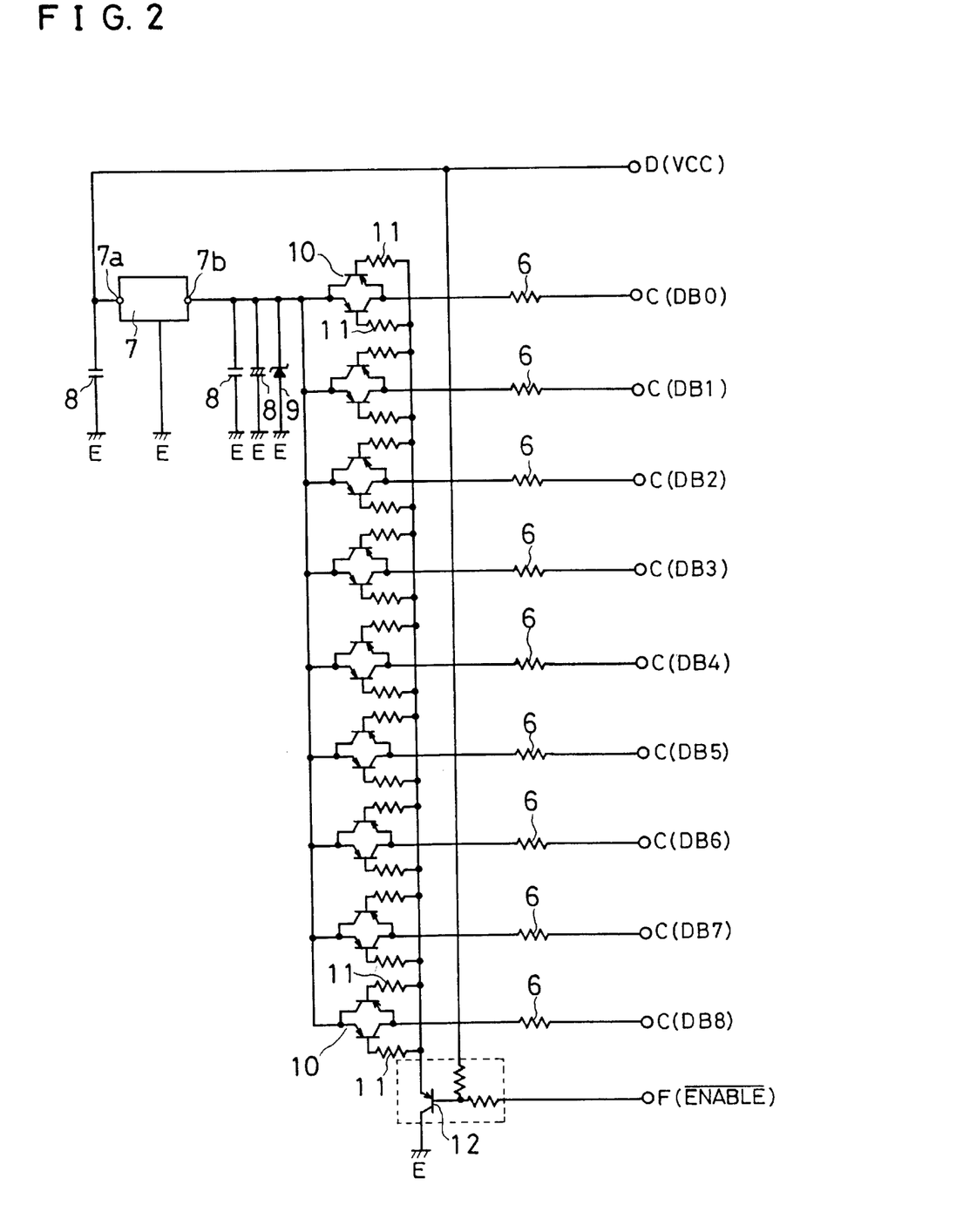
FIG. 2 is a circuit diagram showing a terminating resistance circuit embodying the present invention.

In general, the terminator 6, the regulator 7, the capacitor 8, the zener diode 9, etc. constituting the above described terminating resistance circuit are incorporated within an integrated circuit together with the switching elements, and one example of the integrated circuit is shown in FIG. 2. C point, D point and E point of FIG. 2 are respectively corresponding to C point, D point and E point of FIG. 1. In FIG. 2, the reference numeral 10 denotes a switching element provided between the terminator 6 and the regulator 7, which is constituted by two PNP transistors. The reference numeral 11 denotes a bias resistor for applying a bias voltage to the switching element 10, and the reference numeral 12 (a portion surrounded by a dotted line) is a further switching element which is a transistor incorporating resistor. The switching element 12 functions as a switch for turning the switching element 10 on or off in response to a signal from an exterior source. Although only 9 terminators 6 are illustrated for simplifying the drawing, in fact, the number of terminators 6 is 18, that is, the number of the signal lines. In addition, in a case where only 9 terminators 6 are provided as shown in FIG. 2, two integrated terminating resistance circuits may be utilized.

Meanwhile, the terminating resistance circuit shown in FIG. 2 is only an example, and therefore, an arbitrary circuit can be utilized while an object of the present invention can be performed. For example, in a case where the terminating resistance circuit is to be integrated on the substrate, the switching element 10, the switching element 12, the capacitor 8, etc. may be provided on a separate substrate. In a case where the terminator 6 is not needed to be electrically attached or detached, it is unnecessary to provide the switching elements 10 and 12.

Figure 3:
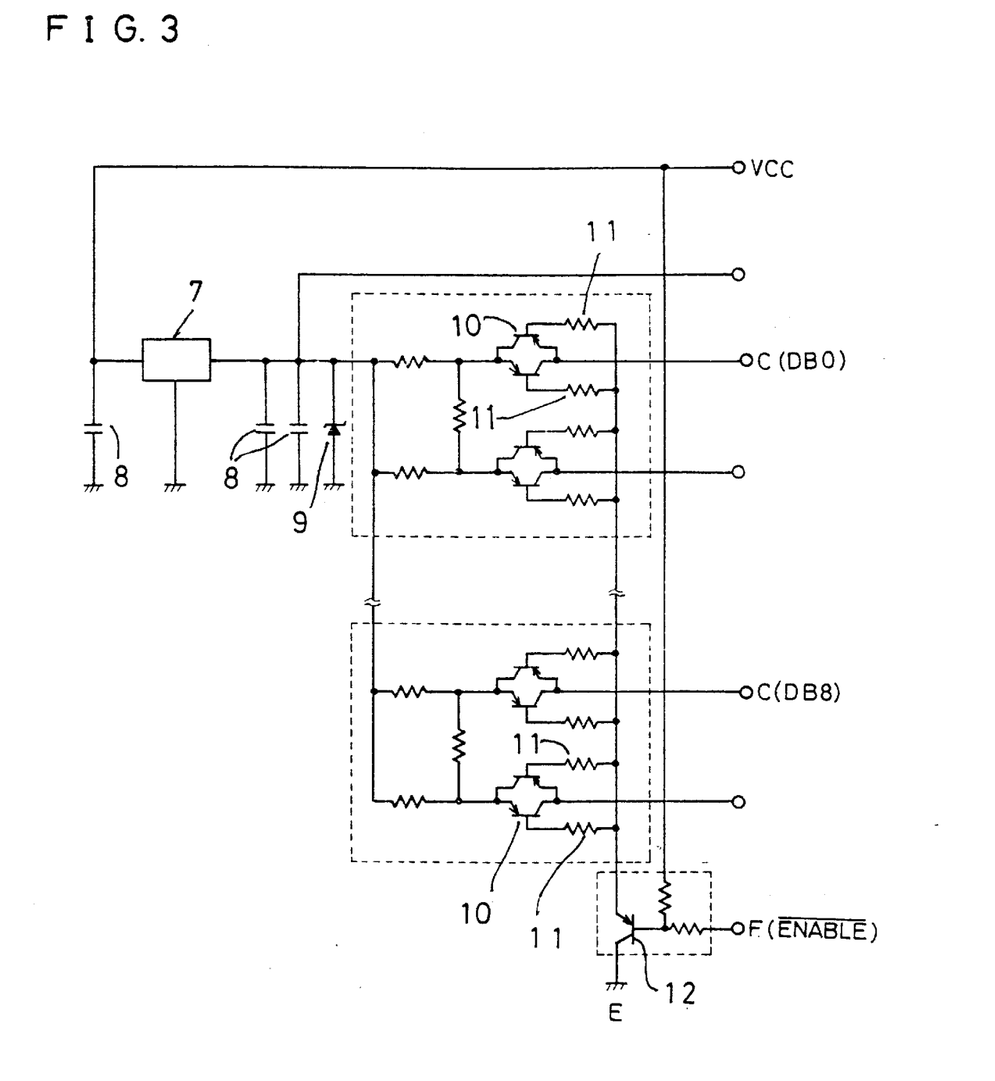
FIG. 3 is a circuit diagram showing another terminating resistance circuit embodying the present invention.

In addition, the present invention can be applied to the single-ended type as well as a differential type shown in FIG. 3. In FIG. 3, elements and parts corresponding to those in FIG. 2 are labeled with the same reference numerals.

Furthermore, it is preferable that the terminating resistance circuit according to any one of the embodiments is manufactured by utilizing a hybrid IC technique, but the same may be manufactured by utilizing another method such as a monolithic IC technique.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A terminating resistance circuit for connection to a bus line, said bus line including a power source line, a plurality of signal lines, and a ground line, for being connected between computer equipment, said circuit comprising:
   a plurality of drivers and receivers for being respectively connected to corresponding ones of the plurality of signal lines, each said driver receiving a power source voltage;
   said drivers applying high and low voltage signal levels to said respective signal lines, and said receivers detecting said high and low signal levels;
   a constant voltage circuit having an input terminal for connection to the power source line, an output terminal for supplying a substantially constant voltage, and a ground terminal for being connected to the ground line;
   all of the signal lines being connected to said output terminal via respective terminating resistors; and
   a zener diode having a cathode which is connected to the output terminal of the constant voltage circuit and an anode which is connected to the ground line, said zener diode having a zener voltage;
   said zener voltage being higher than said substantially constant voltage at the output terminal of said constant voltage circuit, and being higher than said low signal levels applied to said signal lines, and being lower than said power source voltage received by said drivers;
   whereby said zener diode provides a current path from respective ones of said signal lines having high signal levels applied thereto, and diverts current away from respective ones of said drivers corresponding to signal lines having low signal levels applied thereto.

2. A terminating resistance circuit according to claim 1, wherein each said driver receives said power source voltage from said power source line.

3. A terminating resistance circuit according to claim 2, wherein each said driver receives said power source voltage from said power source line.

4. In combination, the terminating resistance circuit of claim 1, in combination with a bus line, wherein the input terminal is connected to the power source line of said bus line, the output terminal is connected to the signal lines of said bus line via the respective terminating resistors, and the ground terminal is connected to the ground line of said bus line.

5. A combination according to claim 4, wherein each said driver receives said power source voltage from said power source line.

6. A terminating resistance circuit according to claim 5, wherein each said driver comprises an active negation circuit.

7. A terminating resistance circuit according to claim 1, wherein each said driver comprises an active negation circuit.

8. A terminating resistance circuit for connection to a bus line, said bus line including a power source line, a plurality of signal lines, and a ground line, for being connected between computer equipment, said circuit comprising:
   a plurality of drivers and receivers for being respectively connected to corresponding ones of the plurality of signal lines, each said driver receiving a power source voltage;
   said drivers applying high and low voltage signal levels to said respective signal lines, and said receivers detecting said high and low signal levels;
   a constant voltage circuit having an input terminal for connection to the power source line, an output terminal for supplying a substantially constant voltage, and a ground terminal for being connected to the ground line;
   all of the signal lines being connected to said output terminal via respective terminating resistors; and
   a circuit connected to the output terminal of the constant voltage circuit which provides a current path to ground from respective ones of said signal lines having high signal levels applied thereto, and thereby diverts current away from respective ones of said drivers corresponding to signal lines having low signal levels applied thereto.

* * * * *